(12) United States Patent
Tanaka

(10) Patent No.: US 6,744,199 B1
(45) Date of Patent: Jun. 1, 2004

(54) ORGANIC EL DEVICE AND METHOD OF MANUFACTURING THE SAME

(75) Inventor: Haruo Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/447,419

(22) Filed: Nov. 23, 1999

(30) Foreign Application Priority Data

Nov. 27, 1998 (JP) .......................................... 10-337976

(51) Int. Cl.[7] .......................... H05B 33/00; H05B 33/04
(52) U.S. Cl. ........................ 313/512; 313/511; 313/506
(58) Field of Search ................................ 313/495, 496, 313/497, 498–512; 445/24, 25

(56) References Cited

U.S. PATENT DOCUMENTS

| | | | | |
|---|---|---|---|---|
| 4,213,074 A | * | 7/1980 | Kawaguchi et al. ........ | 313/509 |
| 4,303,847 A | * | 12/1981 | Glaser ........................ | 313/549 |
| 4,427,479 A | * | 1/1984 | Glaser et al. ................ | 445/25 |
| 4,857,803 A | * | 8/1989 | Anderson, Sr. ............. | 313/509 |
| 5,072,263 A | * | 12/1991 | Watanabe et al. ........... | 257/81 |
| 5,118,986 A | * | 6/1992 | Ohnuma et al. ............ | 313/504 |
| 5,482,614 A | * | 1/1996 | Kondo et al. ............... | 205/171 |
| 5,990,615 A | * | 11/1999 | Sakaguchi et al. .......... | 313/504 |
| 6,146,225 A | * | 11/2000 | Sheats et al. ................ | 445/24 |

* cited by examiner

*Primary Examiner*—Vip Patel
*Assistant Examiner*—Mariceli Santiago
(74) *Attorney, Agent, or Firm*—Morgan, Lewis & Bockius LLP

(57) ABSTRACT

An organic EL device includes a lower electrode formed on a substrate; an organic EL layer formed on the lower electrode; an upper electrode formed on the organic EL layer; a sealing member for sealing the lower electrode, organic EL layer and upper electrode on the substrate. The sealing member is made of an aluminum material coated with an insulating layer in its inner surface. Since the inner surface of the sealing member is coated with the insulating layer, contact of the sealing member with the upper electrode produces no trouble. Since the surface of the insulating layer 4 is porous, by removing the gas from the surface of the insulating layer 4, impurities in the internal space 5 can be taken into a large number of pores of the insulating layer 4. In such a configuration, a thin-profile and reliable organic EL device can be provided which can be manufactured with improved efficiency of manufacture and at reduced production cost.

4 Claims, 3 Drawing Sheets

ORGANIC EL DEVICE AND METHOD OF MANUFACTURING THE SAME

BACKGROUND OF THE INVENTION

1. Field of the Invention

The present invention relates to an organic EL device, and more particularly to an organic EL device provided with a sealing member for sealing a lower electrode, an organic EL layer and an upper electrode.

2. Description of the Related Art

FIG. 2 is a perspective view of an conventional EL display panel 25 provided with an organic EL device. In the EL display panel 25, a plurality of strip-shaped transparent electrodes 11 of ITO (Indium Tin Oxide) (hereinafter referred to as an ITO transparent electrode(s)) are arranged on a glass substrate 2 in a direction of arrow 93. Above the ITO transparent electrodes, a plurality of strip-shaped organic layers 12 are arranged in a direction of arrow 94. A plurality of strip-shaped upper electrodes 13 are superposed on the organic layers 12, respectively.

FIG. 3 is a sectional view of the conventional EL display panel 25, taken in line I—I in FIG. 2. As seen from FIG. 3, the ITO transparent electrodes 11 as a lower electrode, organic EL layers 12 and upper electrodes 13 are covered with and sealed by a cap 15 on the glass substrate 2. The cap 15, which is made of metal or glass, is secured to the glass substrate 2 by adhesive. The internal space 17 of the cap 15 is filled with nitrogen.

Generally, deposition of impurities such as moisture on an organic EL device greatly changes a device characteristic. This largely attenuates reliability of the organic EL device. In order to over come such an inconvenience, an adsorbent 16 of barium oxide is provided within the cap 15 to adsorb the impurities such as moisture.

In the EL display panel 25, when a voltage is applied between a prescribed ITO transparent electrode 11 and a prescribed upper electrode 13, an organic EL layer 12 located at an area where these electrodes are overlapped, emits light. Therefore, by controlling selection of each ITO transparent electrode 11 and each upper electrode 13, a desired display can be realized using the EL display panel 25.

The above conventional organic has the following defects. Sealing by the cap 15 requires for the cap 15 to be formed in a prescribed shape. This leads to poor efficiency and high cost in manufacturing.

Particularly, when the cap 15 of metal is used, the upper electrode 14 and cap 15 must be kept into non-contact with each other. Therefore, in order to secure the cap 15 on the glass substrate 2, it must be adjusted in position and thereafter bonded to the glass substrate 2. This leads to poor efficiency and high cost in manufacturing. Further, in order to assure the non-contact between the upper electrode 13 and the cap 15, an insulator such as an insulating material or space (e.g. space L1 shown in FIG. 3) must be located therebetween. This impedes the thin-profiling of the organic EL device.

Further, provision of the adsorbent 16 within the cap 15 further impedes thin-profiling of the organic EL device. In addition, the provision of the adsorbent 16 results in poor workability and high cost in manufacturing.

SUMMARY OF THE INVENTION

A first object of the present invention is to provide an organic EL device which can provide high efficiency of manufacturing, reduce production cost, obtain great reliability and realize thin-profiling.

A second object of the present invention is to provide a method of manufacturing such an organic EL device.

In order to attain the above first object, in accordance with the present invention, there is provided an organic EL device comprising: a lower electrode formed on a substrate; an organic EL layer formed on the lower electrode; an upper electrode formed on the organic EL layer; a sealing member for sealing the upper electrode, organic EL layer and upper electrode on the substrate so that they are covered with the sealing member, wherein the sealing member is made of an aluminum material coated with an insulating layer in its inner surface.

In this configuration, since the sealing member is made of an aluminum material coated with an insulating layer in its inner surface, contact of the aluminum material with the upper electrode produces no trouble. Thus, such a fine alignment as required in sealing by a metallic cap is not required, thereby improving working efficiency and reducing the production cost. Further, any insulator for assuring non-contact between the aluminum material and the upper electrode is not required so that the organic EL device can be formed in a thin-profile style. In addition, the aluminum foil is so flexible that it can be deformed freely, thereby improving working efficiency and reducing the production cost.

Preferably, the aluminum material is a flexible aluminum sheet. Therefore, it is not necessary to form the aluminum material in a prescribed shape in advance, thereby improving working efficiency and reducing the production cost.

Preferably, the insulating layer is an aluminum oxide layer formed by anodic oxidation of the aluminum material. Since the surface of such an-oxide layer is porous, impurities can be taken into a large number of pores of the anodic oxide layer, thereby improving the reliability of the organic EL device. This oxide layer has both functions of insulation and absorbing the impurity such as moisture. For this reason, it is not necessary to provide an insulator and an impurity absorbing member individually, thereby providing a thin-profile EL device and improving working efficiency and reducing the production cost.

Preferably, the insulating layer is a porous aluminum oxide layer. Since such a porous oxide layer can have a function of "gettering" of taking impurities into a large number of pores, it can take the impurities internally generated during use, thus lengthening the life of the organic EL device.

Preferably, the aluminum sheet is formed in such a manner that a surface of the aluminum oxide layer is subjected to gas flow-out treatment in vacuum, and thereafter the lower electrode, organic EL layer and upper electrode are sealed on the substrate in an atmosphere of inert gas.

In this configuration, the surface of the aluminum oxide layer is subjected to gas flow-out treatment, and the lower electrode, organic EL layer and upper electrode are sealed on the substrate by the sealing member. Therefore, gas can be caused to flow out from the large number of pores of the aluminum oxide layer so that the impurity can be taken into the pores, thereby improving the reliability of the organic EL device. In order to attain the second object, in accordance with the present invention, there is provided a method of manufacturing an organic EL device comprising the steps of: forming a lower electrode formed on a substrate; forming an organic EL layer on the lower electrode; forming an upper electrode on the organic EL layer to provide the organic EL device; preparing an aluminum material coated with an insulating layer in at least its inner surface; and sealing the organic EL device so that it is covered with the aluminum material.

In the manufacturing method, preferably, the step of preparing the aluminum material comprises the steps of: making anodic oxidation to form an aluminum oxide layer on a surface of a flexible aluminum sheet; and removing gas contained within the aluminum oxide layer, and the step of sealing the organic EL device comprises the step of: fixing the aluminum sheet with the gas removed on a surface of the substrate in an atmosphere of inert gas or in vacuum.

In the manufacturing method, preferably, the step of removing gas is to heat the aluminum sheet with the aluminum oxide layer for several –60 minutes at 60–300° C. in vacuum.

In the manufacturing method, preferably, the step of making anodic oxidation is to form a porous aluminum oxide layer; and the step of removing gas is to heat the aluminum sheet in vacuum so that impurities contained in pores of the porous aluminum oxide layer are discharged.

In the manufacturing method, the step of sealing the organic EL device comprises the steps of: mounting the organic EL device and aluminum sheet in a sealing chamber and once heating them at room temperature –150°C. in vacuum; introducing inert gas into the sealing chamber; and fixing the aluminum sheet on the substrate through an adhesive and heating it.

In the manufacturing method, preferably, the inert gas is argon gas.

The above and other objects and features of the present invention will be more apparent from the following description taken in conjunction with the accompanying drawings.

DESCRIPTION OF THE PREFERRED EMBODIMENTS

Figure 1:
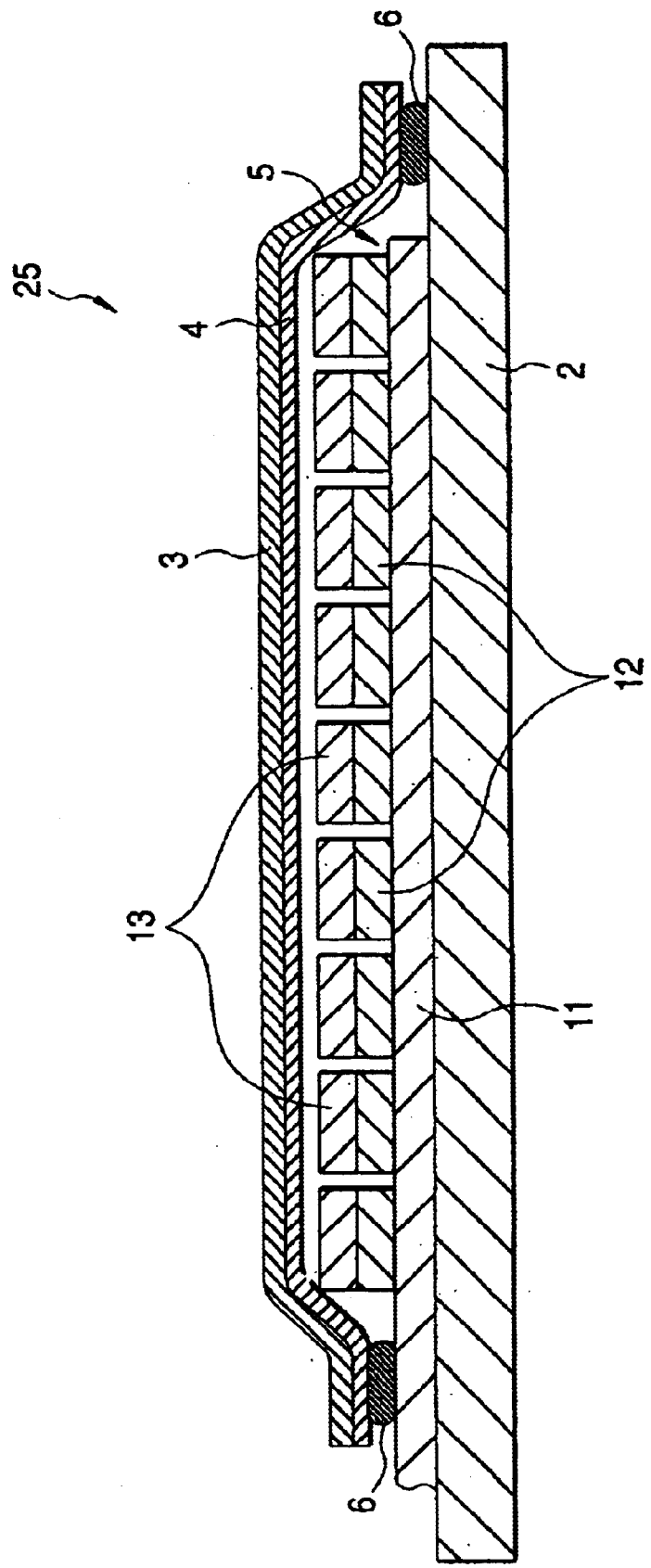
FIG. 1 is a side sectional view of an EL display panel which is an embodiment of an organic EL device according to the present invention and also a sectional view taken in line I—I in FIG. 2.
Figure 2:
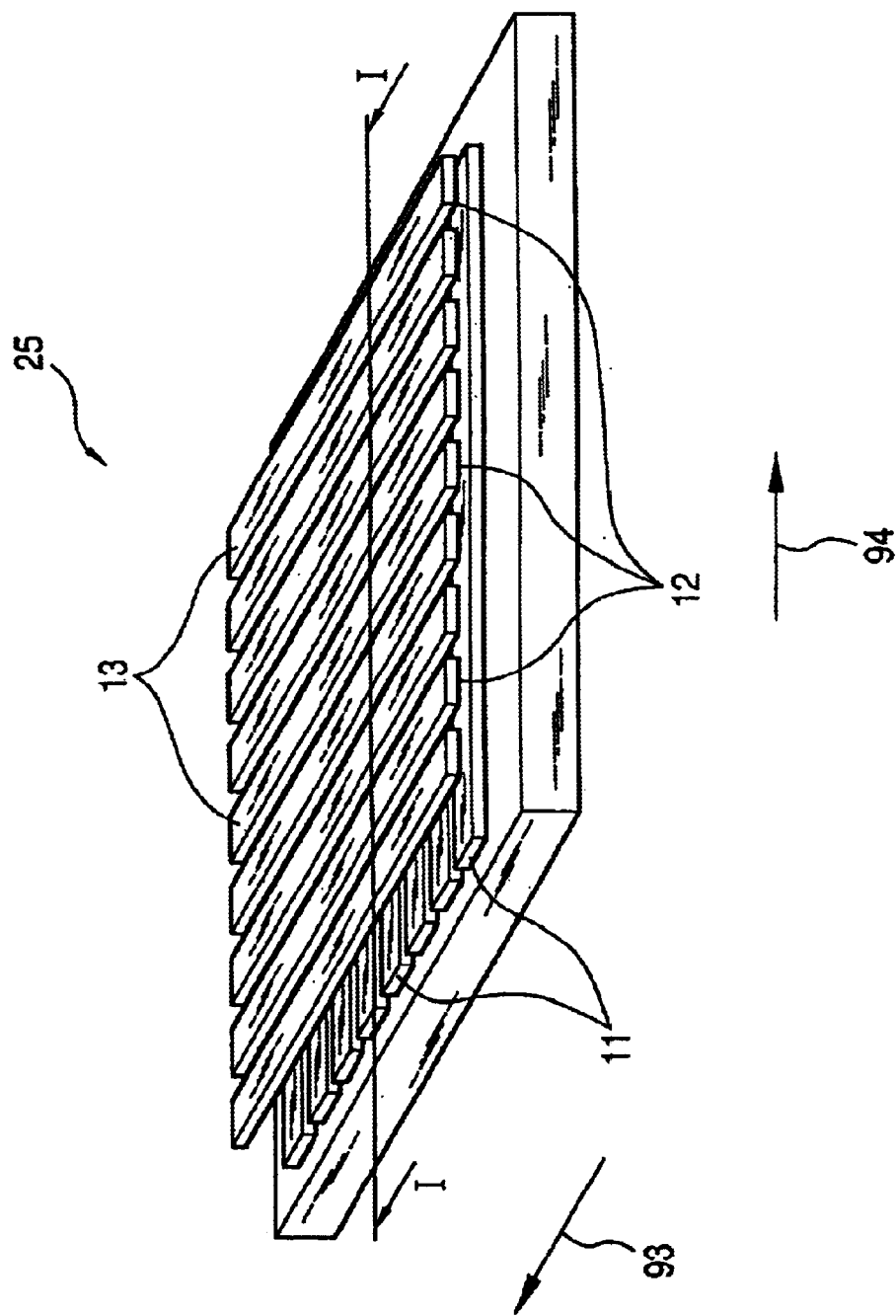
FIG. 2 is a perspective view of an EL display panel 25 using an organic EL device.
Figure 3:
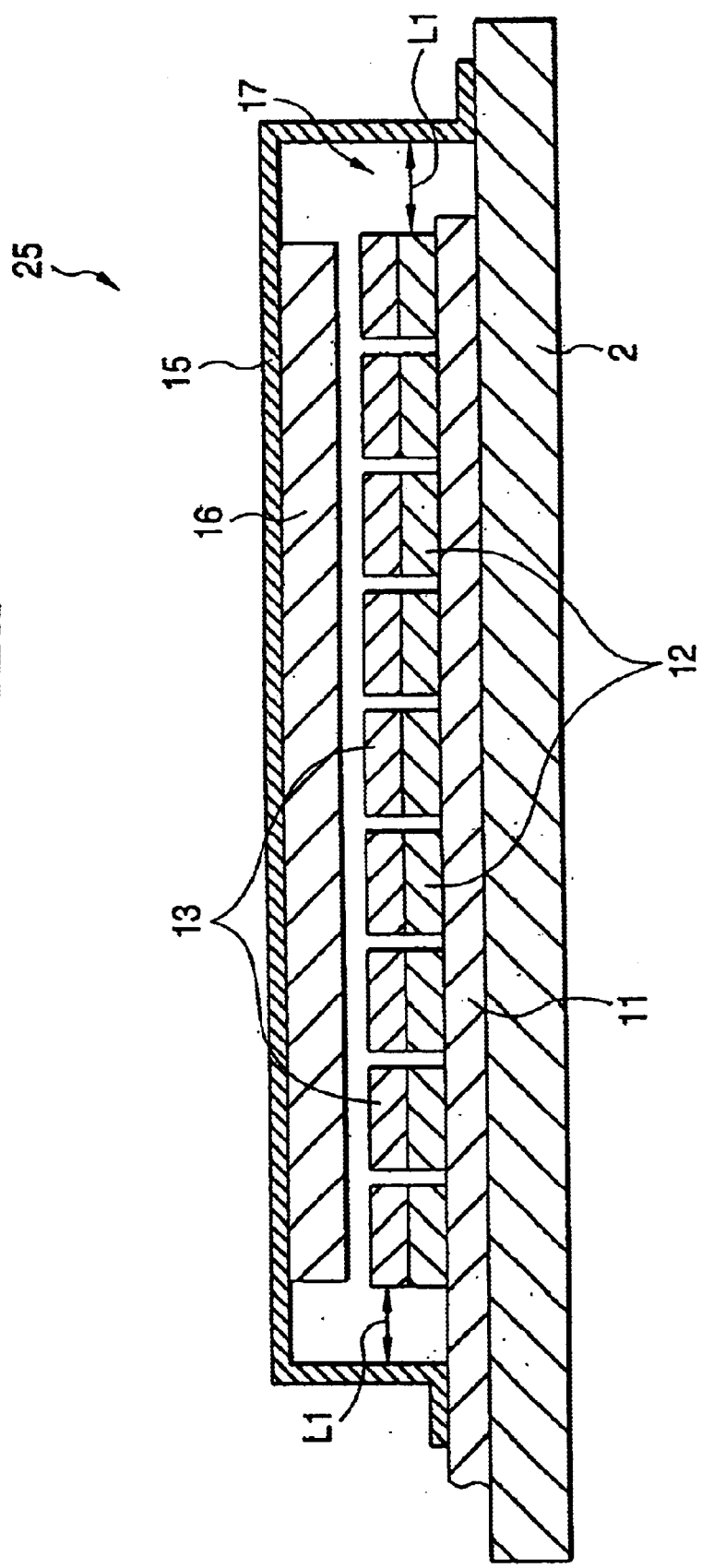
FIG. 3 is a side sectional view of a conventional EL display panel 25 and also a sectional view taken in line I—I.

An explanation will be given of an embodiment of an organic EL device according to the present invention taking an EL display panel of an EL display as an example. FIG. 1 is a side sectional view of an EL display panel 25 according to the embodiment and also a sectional view taken in line I—I in FIG. 2. FIG. 2 is a perspective view of the EL display panel 25.

As seen from FIG. 2, in the EL display panel 25, a plurality of strip-shaped transparent electrodes 11 made of ITO (Indium Tin Oxide) are arranged on a glass substrate 2 in a direction of arrow 93. Above the ITO transparent electrodes, a plurality of strip-shaped organic layers 12 are arranged in a direction of arrow 94 which is on the plane to which the direction of arrow 93 belongs to and which is orthogonal to the arrow 93. A plurality of strip-shaped upper electrodes 13 are superposed on the organic layers 12, respectively.

FIGS. 1 and 2 schematically show the transparent lower electrodes 11, which are arranged on a glass substrate 2, organic layers 12 which are organic EL layers, and upper electrodes 13. Actually, a large number of minute ITO transparent electrodes as the transparent lower electrodes 11, organic layers 12 and upper electrodes 13 are arranged on the glass substrate 2.

In the EL display panel 25, when a voltage is applied between a prescribed transparent lower electrode 11 and a prescribed upper electrode 13, an organic EL layer 12 located at an area where these electrodes are overlapped emits light. Therefore, by controlling selection of each ITO transparent electrode 11 and each upper electrode 13, a desired display can be realized using the EL display panel 25.

The ITO transparent electrodes 11, organic layers 12 and upper electrodes 13 are sealed with an aluminum foil 3 serving as a sealing member or aluminum sheet, and an internal space 5 is filled with argon gas. On the internal face of the aluminum foil 3, an anodized-aluminum (Alumilite) layer 4 is formed serving as an insulating layer or anodic oxide layer.

In this embodiment, an aluminum foil 3 having a thickness of about 10 $\mu$m is used. Another aluminum foil that is thicker or thinner than it may be used. The respective terminals of the ITO transparent electrodes 11 and upper electrodes 13 are taken out from the aluminum foil 3. On the other hand, the organic layers 12 are completely housed within the aluminum foil 3 so that impurities such as moisture are not applied to the organic layers 12.

The aluminum foil 3 in this embodiment will be made by the following process, and is secured to the glass substrate 2 so as to cover the ITO transparent electrodes 11, organic layers 12 and upper electrodes 13. First, the aluminum foil 3 is immersed in an electrolyte solution of e.g. nitric acid. By anodic oxidation, the Alumilite (Alumina) layer 4 is formed on the surface of the aluminum foil 3. The surface of the Alumilite layer 4 is so porous as to have a large number of minute pores.

The aluminum foil 3 provided with the Alumilite layer 4 is located in vacuum and heated at high temperatures (60–300° C.) for about several to 60 minutes to increase kinetic momentum. Thus, the gas contained in the pores in the surface of the Alumilite layer 4 is removed (gas flow-out processing). Thereafter, the aluminum foil 3 provided with the Alumilite layer 4 is shifted from vacuum to argon atmosphere so that it is not exposed to air. The glass substrate 2 on which the lower electrodes 11 of ITO transparent electrodes, organic layers 12 and upper electrodes 13 are formed is covered with the aluminum foil 3.

The Alumilite layer 4 formed on the surface of the aluminum foil 3 performs a function of insulation. For this reason, contact of the aluminum foil 3 with the upper electrode 13 produces no trouble. Thus, any fine alignment is not required when the aluminum foil 3 put on the glass substrate 2, thereby improving working efficiency and reducing the production cost.

Further, any insulator is not required between the aluminum foil 3 and the upper electrode 13 so that the organic EL device can be formed in a thin-profile style. In addition, the aluminum foil is so flexible that it can be deformed freely, thereby improving working efficiency and reducing the production cost.

The aluminum foil 3 put on the glass substrate 2 is bonded and secured to the glass substrate 2 by means of sealing resin 6. Putting the aluminum foil 3 on the glass substrate 2 is carried out in an atmosphere of argon. Therefore, the inner space 5 is filled with the Ar gas. Further, since the Alumilite layer 4 is porous, moisture which may be taken into the inner space 5 is taken in the pores and held there.

Thus, the Alumilite layer 34 has both functions of insulation and absorbing the impurity such as moisture, thereby providing a thin-profile and reliable EL device.

In another embodiment of the organic EL device according to the present invention, a character, picture, etc. can be partially labelled on the surface of the Alumilite layer 4 of the EL display panel as shown in FIG. 1. The character, picture, etc. can be labelled by e.g. printing. In this case, the upper electrode 13 also adopts a transparent ITO electrode. Thus, the character, picture, etc. can be checked visually from the outside of the EL display panel 25 through the glass substrate 2, ITO transparent electrode 11, organic layer 12 and upper electrode 13.

The organic EL device according to the present invention should not be limited to the embodiments described above. For example, in the embodiment described above, the aluminum foil 3 was secured to the glass substrate 3 in the argon atmosphere so that it is put on the ITO transparent electrode 11, organic layer 12 and upper electrode 13, and the internal space 5 is filled with argon. However, the aluminum foil 3 may be secured to the glass substrate 2 in an atmosphere of nitrogen, and the internal space 5 may be filled with nitrogen.

Although the embodiment of the present invention was explained in connection with a monochromatic EL display panel, the present invention can be applied to a color EL display panel.

What is claimed is:

1. An organic EL device comprising:

a lower electrode formed on a substrate;

an organic EL layer formed on the lower electrode;

an upper electrode formed on the organic EL layer;

a sealing member for sealing said lower electrode, organic EL layer and upper electrode on said substrate so that they are covered with the sealing member, wherein said sealing member is further comprised of an aluminum material and is coated by anodic oxidation with an absorbing material made of a porous aluminum oxide.

2. An organic EL device according to claim 1, wherein said aluminum material is a flexible aluminum sheet.

3. An organic EL device according to claim 1, wherein said aluminum material is formed in such a manner that a surface of said aluminum oxide layer is subjected to gas flow-out treatment in vacuum such that the pores of the surface of the aluminum oxide layer are substantially free of gases, and thereafter said lower electrode, organic EL layer and upper electrode are sealed on the substrate in an atmosphere of inert gas.

4. An organic EL device according to claim 1, wherein said sealing member has a thickness of approximately 10 $\mu$m.

* * * * *